United States Patent
Streltsov

(10) Patent No.: US 6,829,147 B2
(45) Date of Patent: Dec. 7, 2004

(54) MULTILAYERED HYBRID ELECTRONIC MODULE

(75) Inventor: Nikolai Victorovich Streltsov, Ekaterinburg (RU)

(73) Assignee: Sÿnergestic Computing Systems ApS (DK)

(*) Notice: Subject to any disclaimer, the term of this patent is extended or adjusted under 35 U.S.C. 154(b) by 0 days.

(21) Appl. No.: 10/451,240

(22) PCT Filed: Dec. 21, 2001

(86) PCT No.: PCT/DK01/00864

§ 371 (c)(1),
(2), (4) Date: Jun. 20, 2003

(87) PCT Pub. No.: WO02/51224

PCT Pub. Date: Jun. 27, 2002

(65) Prior Publication Data

US 2004/0066638 A1 Apr. 8, 2004

(30) Foreign Application Priority Data

Dec. 21, 2000  (RU) .................................. 2000131924

(51) Int. Cl.[7] .................. H05K 7/02; H01L 23/043
(52) U.S. Cl. .................. 361/729; 361/730; 361/728; 361/735; 361/760; 257/685; 257/686
(58) Field of Search .................. 361/736, 748, 361/760, 735, 788, 728, 729, 730; 257/685, 686

(56) References Cited

U.S. PATENT DOCUMENTS 4,137,559 A * 1/1979 Reuting ..................... 361/735
5,021,868 A * 6/1991 Matsuoka ................... 257/689
5,028,985 A * 7/1991 Matsuoka ................... 257/689
5,303,121 A * 4/1994 Thornberg .................. 361/760
5,728,972 A * 3/1998 Hsu ........................ 174/52.1
6,210,175 B1 * 4/2001 Payne ........................ 439/69
6,634,095 B2 * 10/2003 Colbert et al. ............... 29/740
6,678,163 B1 * 1/2004 Neal et al. .................. 361/729

* cited by examiner

Primary Examiner—Randy W. Gibson
Assistant Examiner—Dameon E. Levi
(74) Attorney, Agent, or Firm—Stites & Harbison PLLC; Marvin Petry

(57) ABSTRACT

The invention is related to the computer science and may be used in the design of miniature high-performance computing systems. The purpose of the invention is to increase the IC stuffing density and to reduce the microelectronic module assembly effort. The multilayered hybrid electronic module contains a backplane with multilayer wiring with ICs and sockets installed. A socket body is a box of elastic dielectric material, whose vertical walls have vertical metallized contact slots connected to the contact pads on the outer bottom surface of the socket. IC packages to be installed in the sockets have a rigid peripheral frame with cylindrical leads on the perimeter. The leads are parallel to the base of the package and lie in the same plane. Dimensions and shape of the IC package correspond to those of the socket cavity. Dimensions and positions of the IC leads correspond to those of the contact slots. IC packages may also have raised tabs for proper spacing between ICs installed in the same socket and for easier removal of ICs from the socket. Forced cooling of ICs in the socket is allowed by air passages in the socket body aligned with chip-to-chip gaps. The contact surface between socket contact slots and IC leads may be increased by using leads with larger diameter arranged in two planes in a checkerboard pattern.

3 Claims, 1 Drawing Sheet

MULTILAYERED HYBRID ELECTRONIC MODULE

Figure 1:
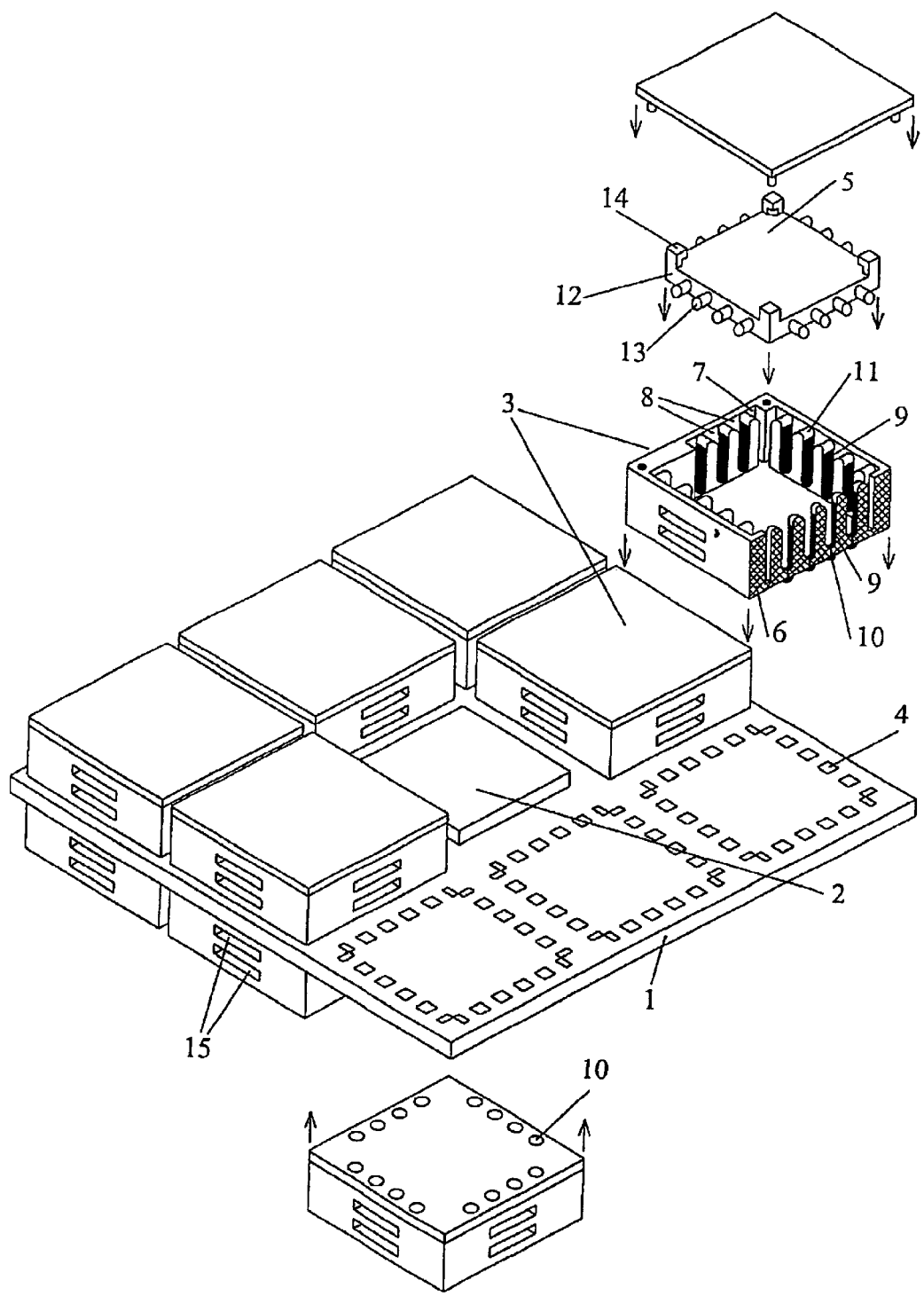

The invention is related to the computer science and may be used in the design of miniature high-performance computing systems.

In a known device, multilayered hybrid electronic module (RU, 1753961), each layer contains a board with bare ICs mounted on its surface. A stack of boards is permanently assembled as a module, thus making quick reconfiguration of the device and replacement of faulty components impossible.

These shortcomings are significantly reduced by another known design of a microelectronic module with elastic connectors (For the prototype see Vozhenin, I. N., Blinov, G. A., Koledov, L. A. et al. Microelectronic equipment with unpackaged Ics. Ed. by I. N. Vozhenin. Moscow, Radio i svyaz, 1985, pp. 52–53—Воженин И. Н., Блинов Г. А., Коледов Л. А. и др. Под ред. И. Н. Воженина—М. "Радио и связь", 1985, стр. 52–53). A multilayered structure of the module is installed on top of a backplane electrically connected to the external connectors of the module. The module consists of several stacked boards with elastic conducting leads on two sides of the perimeter each. The boards are squeezed together with a set of studs, thus an electrical connection is made between the leads of adjacent boards. Shortcomings of this device are low reliability of the elastic conducting leads and their low packing density.

The purpose of the invention is to increase the IC packaging density and to reduce effort in the assembly of high-performance computing modules.

The problem in question is solved by the proposed multilayered hybrid electronic module. It contains a two-sided backplane with multi-layer wiring and ICs and sockets mounted on its surfaces. Their leads are connected to the corresponding contact pads on the backplane, and each socket contains up to K chips stacked on top of each other. According to the invention, socket body is a box of elastic dielectric material, whose vertical walls have vertical contact and buffer slots. The inner surface of each contact slot is metallized and connected to the corresponding lead on the outer bottom surface of the socket. Vertical ribs formed by adjacent slots are rounded and not metallized in the top part, providing for guidance and positioning of a chip being installed into the socket. IC packages to be installed in the sockets have a rigid peripheral frame with cylindrical leads on the perimeter. The leads are parallel to the package base and lie in the same plane. Dimensions and shape of the IC package correspond to those of the socket cavity. Dimensions and positions of the IC leads correspond to those of the contact slots.

Furthermore, according to the invention, the IC leads may be arranged in a checkerboard pattern in two planes parallel to the base of the package, with the distance between two adjacent leads (lying in different planes) being greater than the thickness of the rib formed by the slots corresponding to these leads, and the diameter of the leads being greater than the width of the corresponding slots. The increase in diameter of the leads and the distance between the leads is to be chosen so as not to interfere with chip installation into the socket.

Furthermore, according to the invention, the IC package has raised tabs whose shape allows them to be used for removal of the chip from the socket and also creates a gap between chips stacked in the socket. The socket has air passages at the levels of these gaps to allow for forced air cooling of the chips.

The said combination of features has not been found by novelty search, are essential and in their combination provide for an increase in IC packaging density and a reduction in effort when assembling modules of high-performance computing systems. This improvement is achieved as follows. Minimum diameter of leads acceptable for quality assembly and reliable contact is 0.5 mm. Minimum spacing between contacts is also 0.5 mm. If the lead is 1 mm long and the thickness of the socket body between a contact slot and an outer surface is 0.5 mm, the surface area of one external contact is 1.5 sq. mm. Most types of connectors (blade, pin and elastic) are manufactured with a 2.5 mm pitch, hence the surface area of one external contact exceeds 6 sq. mm. Thus, the use of he said sockets allows to increase the contact density fourfold, and accordingly, to increase the packaging density.

Installation of a chip into a socket does not require long and complex operations but requires only an insertion of the chip into the slots, which play the role of insertion guides. Automated assembly does not require high-precision positioning, as the latter is assured by the shape of the top portions of the ribs between the slots.

The design of the multilayered hybrid electronic module is shown in FIG. 1.

The multilayered hybrid electronic module (FIG. 1) contains a two-sided backplane 1 with multi-layered wiring, chips 2 and sockets 3 installed on the surfaces of the backplane with the leads connected to the repective contact pads 4 of the backplane, each socket 3 containing up to K chips 5 stacked on top of each other. Socket body 6 is made of elastic dielectric material in the shape of a box whose sides have vertical buffer slots 7 and contact slots 8. The inner surface 9 of each contact slot is metallized and connected to the corresponding lead 10 on the outer surface of the socket bottom. Vertical ribs formed by adjacent slots are rounded and not metallized in the top portion, serving for guidance and positioning of a chip during installation in the socket. IC packages 5 have a rigid peripheral frame 12 with cylindrical leads 13 on its perimeter. Lead axes are parallel to the package base and lie in the same plane. Dimensions and shape of the IC package correspond to those of the socket cavity. Dimensions and positions of the chip leads correspond to those of the contact slots.

IC package 5 has raised tabs 14 whose shape allows to use them for removal of the chip from the socket as well as provides for spacing between chips stacked in the socket. The socket body has air passages 15 aligned with these gaps to allow forced air cooling of the chips.

The multilayered hybrid electronic modules may be used as the principal building blocks of a synergetic computing system where the processor features a large number of external connections. For example, a 32-bit processor consisting of 16 operational units would require, even with time multiplexing of instructions and data, a minimum of sixteen 40-bit paths, i. e. 640 data leads. The processor chip may be placed in the middle of the backplane. Data and instruction memory is placed in 16 sockets installed around the processor (8 sockets on each side of the backplane). 16 groups of 40 contact pads are allocated for this purpose on the backplane, and the sockets are installed on them using flip-chip method. Every socket houses 4 memory chips. I/O chips are placed in the center of the backplane on the side opposite to the processor. External connections are located on the edge of the backplane. Forced air cooling of the module is provided by two fans on both sides of the backplane. As a result, about 66 chips with the total footprint of approximately 68 sq. cm are mounted in the volume of about 126 cu. cm (6×6×3.5 cm).

What is claimed is:

1. A multilayered hybrid electronic module containing a two-sided backplane with multi-layer wiring, chips and sockets installed on both surface of the backplane with their leads connected to the corresponding contact pads of the backplane, with each socket housing up to K chips stacked on top of each other, distinct in the part that the socket body is made of elastic dielectric material in the shape of a box with side walls having vertical buffer and contact slots, the inner surface of each contact slot being metallized and connected to the respective lead of the socket on its outer bottom surface, and vertical ribs formed by adjacent slots have a non-metallized rounded top portion to provide for guidance and positioning of a chip during installation in the socket; packages of the chips to be installed in the socket have a rigid peripheral frame with cylindrical leads on its perimeter, the axes of leads parallel to the chip base and lying in the same plane, with the dimensions and shape of the chip package corresponding to those of the socket cavity and the dimensions and positions of the chip leads corresponding to those of the contact slots.

2. A device per claim 1, distinct in the part that the chip leads are arranged in a checkerboard pattern in two planes parallel to the chip base, with the spacing between adjacent contacts in different planes being greater than the thickness of a rib formed by the slots corresponding to those leads, and the diameter of the leads being greater than the width of the corresponding slots, with the increase in lead diameter and spacing chosen so as not to interfere with installation of chips into the socket.

3. A device per claim 1, distinct in the part that the chip package has raised tabs whose shape allows for easier removal of the chip from the socket as well as provides for spacing between chips stacked in the same socket, with the socket body having air passages aligned with such installation gaps to allow for forced air cooling of the chips.

* * * * *